(12) United States Patent
Akahori

(10) Patent No.: US 8,411,515 B2
(45) Date of Patent: Apr. 2, 2013

(54) SEMICONDUCTOR MEMORY

(75) Inventor: Akira Akahori, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 13 days.

(21) Appl. No.: 13/237,686

(22) Filed: Sep. 20, 2011

(65) Prior Publication Data

US 2012/0092938 A1    Apr. 19, 2012

(30) Foreign Application Priority Data

Oct. 13, 2010  (JP) ................. 2010-230559

(51) Int. Cl.
    *G11C 5/14*    (2006.01)
(52) U.S. Cl. .................. 365/189.09; 365/205
(58) Field of Classification Search ............. 365/189.09, 365/205
    See application file for complete search history.

(56) References Cited

U.S. PATENT DOCUMENTS

| 7,985,963 | B2* | 7/2011 | Rinerson et al. | 257/4 |
| 2009/0059702 | A1* | 3/2009 | Sekiguchi et al. | 365/205 |
| 2009/0231906 | A1* | 9/2009 | Rinerson et al. | 365/151 |

FOREIGN PATENT DOCUMENTS

JP    2000-149569 A    5/2000

* cited by examiner

*Primary Examiner* — Michael Tran
(74) *Attorney, Agent, or Firm* — Studebaker & Brackett PC; Donald R. Studebaker

(57) ABSTRACT

Semiconductor memory including a reference amplifier and a high-speed start-up circuit having four FETs. The reference amplifier supplies the reference voltage to a sense amplifier via a reference voltage supply line. The high-speed startup circuit has four FETs. The first FET is turned on to apply a first voltage onto a first line when the enable signal indicates deactivation. The second FET is turned on to apply ground potential onto the first line when the voltage on the reference voltage supply line is higher than a gate threshold voltage value. The third FET is turned on to generate the first voltage when the enable signal indicates activation. The fourth FET is turned off when the first line is at ground potential and is turned on to supply the first voltage from the third FET onto the reference voltage supply line when the first voltage is applied onto the first line.

14 Claims, 9 Drawing Sheets

US 8,411,515 B2

SEMICONDUCTOR MEMORY

BACKGROUND OF THE INVENTION

1. Field of the Invention

The present invention relates to a semiconductor memory.

2. Description of the Related Art

There is a demand that semiconductor memories should have a greater capacity, lower power consumption, and higher-speed access particularly if the semiconductor memories are mounted in information processing/controlling apparatuses such as computers. In order to realize lower power consumption, a certain type of semiconductor memory forcibly stops the operations of sense amplifiers belonging to those memory blocks which are not involved in data reading. This semiconductor memory also stops the operations of the reference voltage generation circuit which supplies these sense amplifiers with a reference voltage (see FIG. 2 of Japanese Patent Application Publication (Kokai) No. 2000-149569).

In this semiconductor memory, when a sense amplifier in a deactivated condition has to start data reading, the associated reference voltage generation circuit is also has to be turned on. However, it takes time from the start of the operation of the reference voltage generation circuit to when the reference voltage becomes actually ready to provide a desired voltage. Thus, certain time is spent to bring the sense amplifier into the operation condition from the stopped condition, and this hinders the high-speed data reading.

SUMMARY OF THE INVENTION

An object of the present invention is to provide a semiconductor memory capable of performing data reading at high speed with a small-scale configuration and low power consumption.

According to one aspect of the present invention, there is provided a semiconductor memory that includes a sense amplifier for generating information data having a logic level corresponding to a result of comparing, in magnitude, the value of a current supplied to a data line of a memory cell in response to a read signal and a predetermined threshold value. The semiconductor memory also includes a control unit for sending an enable signal indicating one of an activation state and a deactivation state. The semiconductor memory also includes a reference amplifier that, when the enable signal shifts from the deactivation state to the activation state, generates a reference voltage having a voltage value equal to the threshold value and supplies the reference voltage to the sense amplifier via a reference voltage supply line. The semiconductor memory also includes a high-speed startup drive unit having four FETs. The first FET is turned on to apply a predetermined first voltage onto a first line when the enable signal indicates the deactivation state. The second FET is turned on to apply ground potential onto the first line when the voltage on the reference voltage supply line is higher than a gate threshold voltage value. The third FET is turned on to generate the first voltage when the enable signal indicates the activation state. The fourth FET is turned off when the first line is at ground potential and is turned on to supply the first voltage from the third FET onto the reference voltage supply line when the first voltage is applied onto the first line.

When the reference amplifier, in response to the enable signal indicating activation, generates a reference voltage denoting a predetermined threshold value and supplies this reference voltage to the sense amplifier via the reference voltage supply line, a FET is turned on temporarily to forcibly apply a predetermined voltage onto the reference voltage supply line via the this FET immediately after the enable signal switches from a state indicating deactivation to a state indicating activation. Thus, the voltage increase over time in the voltage rise segment of the reference voltage becomes sharp, and hence the reference voltage can be made to immediately converge to a voltage value corresponding to the above-mentioned target threshold value. Therefore, immediately after the reference amplifier shifts from an inactive state to an active state, the sense amplifier can perform a memory read operation. While the enable signal indicating deactivation is being supplied, the reference amplifier stops operating. With the semiconductor memory according to the present invention, data reading can be performed at high speed with the device scale being not large and with low power consumption.

These and other objects, aspects and advantages of the present invention will become apparent to those skilled in the art from the following detailed description when read and understood in conjunction with the appended claims and drawings.

DETAILED DESCRIPTION OF THE INVENTION

A semiconductor memory according to the present invention includes a reference amplifier and a high-speed startup circuit. The reference amplifier generates a reference voltage, which represents a threshold value to be used in determining logic levels, in response to an enable signal indicating activation. The reference amplifier then supplies the reference voltage to a sense amplifier via a reference voltage supply line. The high-speed startup circuit has a first FET that is turned on when the enable signal indicates deactivation so as to apply a predetermined first voltage onto a first line. The high-speed startup circuit also has a second FET that is turned on when the voltage on the reference voltage supply line is greater than a gate threshold voltage value so as to apply ground potential onto the first line. The high-speed startup circuit also has a third FET that is turned on when the enable signal indicates activation so as to supply the first voltage. The high-speed startup circuit also has a fourth FET that is turned off when the first line is at ground potential and is turned on when the first voltage is applied onto the first line so as to supply the first voltage from the third FET onto the reference voltage supply line.

Immediately after the switching of the enable signal from the deactivated condition to the activated condition, the third FET and the fourth FET become an on-state temporarily, so that the first voltage is forcibly applied onto the reference voltage supply line via the third FET and the fourth FET.

Figure 1:
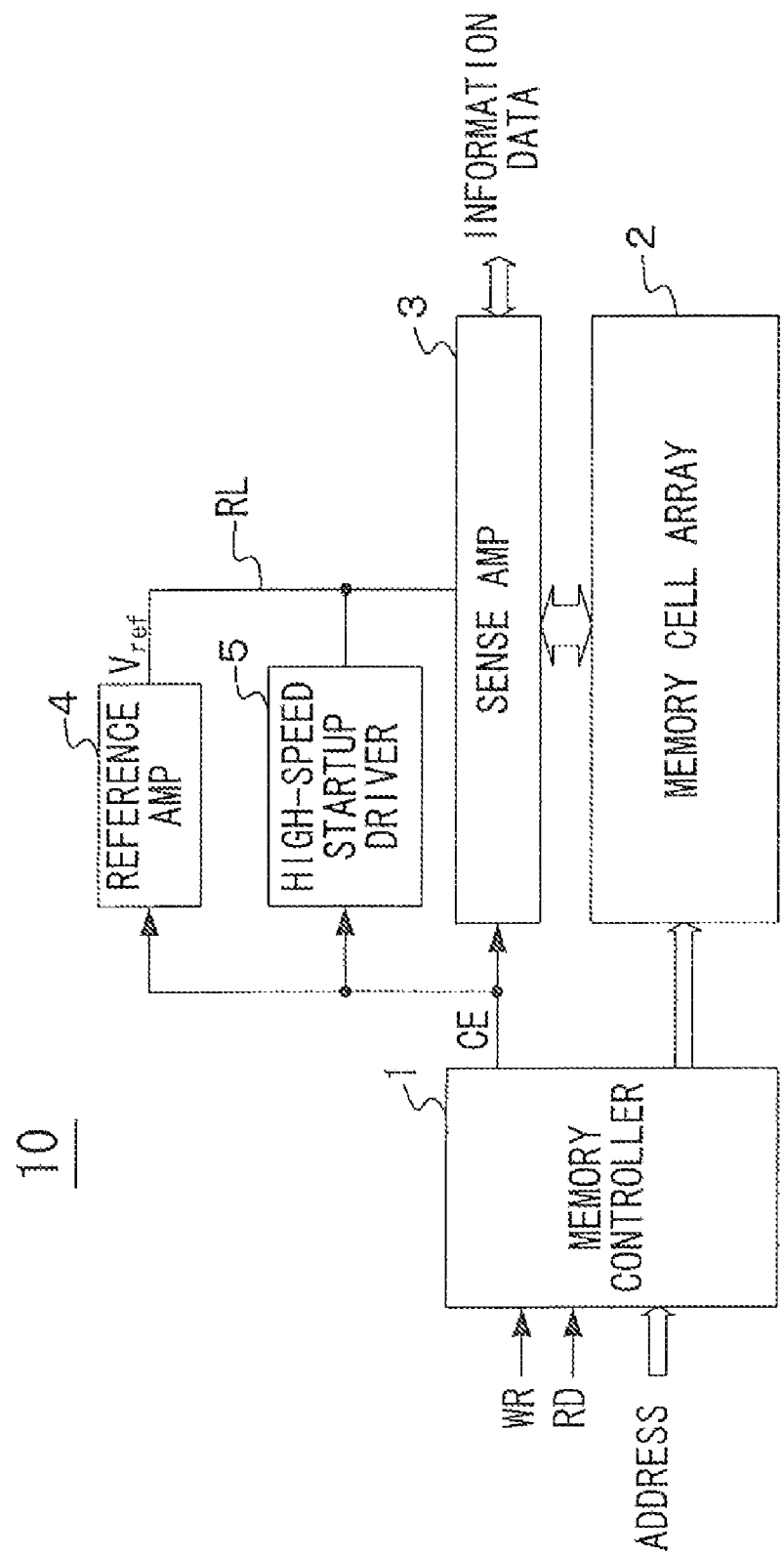
FIG. 1 is a block diagram of the internal configuration of a semiconductor memory according to one embodiment of the present invention.

FIG. 1 shows the internal configuration of the semiconductor memory 10.

This semiconductor memory 10 includes a memory control unit 1, a memory cell array 2, a sense amplifier 3, a reference amplifier 4 and a high-speed startup drive circuit 5.

The memory control unit 1 controls the memory cell array 2 to write information data at the address indicated by address data in response to a write signal WR. Further, the memory control unit 1 controls the memory cell array 2 to read information data at the address indicated by address data in response to a read signal RD, and supplies an enable signal CE having a logic level of 1 to the sense amplifier 3, the reference amplifier 4 and the high-speed startup drive circuit 5 so as to activate the amplifiers 3 and 4 and the startup drive circuit 5. During the time periods within which the reading of information data is not performed, the memory control unit 1 supplies the enable signal CE having a logic level of 0 to deactivate the modules, i.e., to stop the operations of the sense amplifier 3, the reference amplifier 4 and the high-speed startup drive circuit 5.

The sense amplifier 3 is inactive when the enable signal CE having a logic level of 0 is being supplied, whereas the sense amplifier 3 is active when the enable signal CE having a logic level of 1 is being supplied. During the active state, the sense amplifier 3 detects the current flowing through the data line (not shown) connected to each memory cell (not shown) in the memory cell array 2 and determines whether or not the electric current value is higher than the threshold value denoted by the reference voltage Vref. The sense amplifier 3 generates information data as read-out data which has a logic level of 1 when the electric current value detected is higher than the threshold value denoted by the reference voltage Vref and which has a logic level of 0 when the detected current value is not higher than the threshold value.

The memory cell array 2, in response to the write signal WR, receives information data supplied from outside via the sense amplifier 3 and writes this information data into the memory cell (not shown) at the address indicated by address data. The memory cell array 2, in response to the read signal RD, sends the current corresponding to data stored in the memory cell at the address indicated by address data to the sense amplifier 3 via the data line.

The reference amplifier 4 is inactive when the enable signal CE having a logic level of 0 is being supplied, whereas the reference amplifier 4 is active when the enable signal CE having a logic level of 1 is being supplied. Upon shifting from the inactive state to the active state, the reference amplifier 4 starts generating the reference voltage Vref having a predetermined threshold voltage value $V_R$ based on a power supply voltage, and supplies the reference voltage Vref to the sense amplifier 3 via the reference voltage supply line RL as long as the reference amplifier 4 is active. The threshold voltage value $V_R$ of the reference voltage Vref is a threshold value for the sense amplifier 3 to determine whether the value of the current supplied to the data line of the memory cell array 2 indicates the logic level of 0 or 1.

Figure 2:
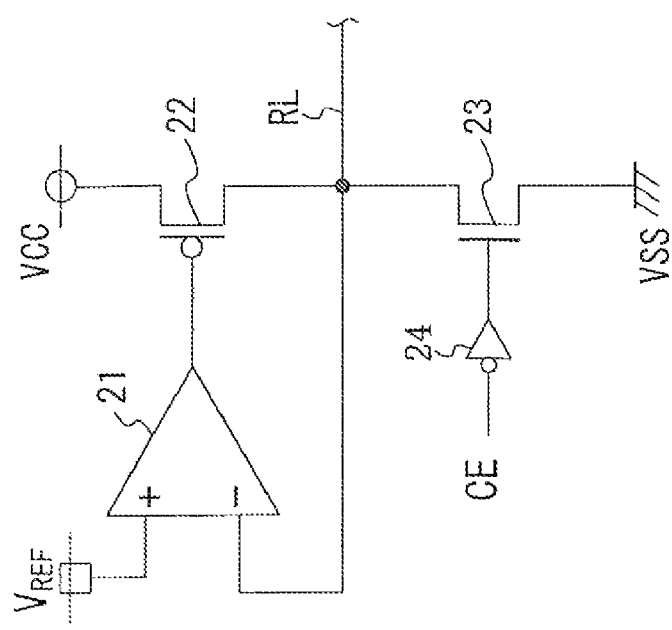
FIG. 2 is a schematic circuit diagram of a reference amplifier provided in the semiconductor memory shown in FIG. 1.

FIG. 2 illustrates the internal configuration of the reference amplifier 4.

As shown in FIG. 2, the reference amplifier 4 includes a differential amplifier 21, a transistor 22 that is a p-channel MOS FET, another transistor 23 that is an n-channel MOS FET, and an inverter 24. The differential amplifier 21 supplies a differential signal corresponding to the voltage difference between the threshold voltage value $V_R$ and the voltage on the reference voltage supply line RL to the gate terminal of the first transistor 22. A voltage VCC is applied to the drain terminal of the first transistor 22, and the source terminal of the first transistor 22 is connected to the reference voltage supply line RL. Ground potential VSS is applied to the source terminal of the second transistor 23, and the drain terminal of the second transistor 23 is connected to the reference voltage supply line RL. The transistor 23 generates an output voltage corresponding to the differential signal, that is, an output voltage having the threshold voltage value $V_R$ based on the voltage VCC and supplies the output voltage as the reference voltage Vref onto the reference voltage supply line RL. An inverse enable signal which is obtained by inverting the enable signal CE in logic level by the inverter 24 is supplied to the gate terminal of the second transistor 23.

With this configuration, while the enable signal CE having a logic level of 1 is being supplied, the second transistor 23 is in the off condition and the reference amplifier 4 is in an active state. Thus, the reference amplifier 4 generates an output voltage having the threshold voltage value $V_R$ and sends the output voltage as the reference voltage Vref onto the reference voltage supply line RL. However, when the enable signal CE shifts from 1 to 0 in logic level, the transistor 23 switches to the on condition, and hence ground potential VSS is applied onto the reference voltage supply line RL via the transistor 23. Thus, during this time, the reference voltage supply line RL is maintained at 0 volts corresponding to ground potential VSS. That is, the reference amplifier 4 is in a state of not generating the reference voltage Vref, i.e., the inactive state. When the enable signal CE shifts from 0 to 1 in logic level, the transistor 23 switches from the on condition to the off condition, and hence the reference amplifier 4 shifts to the active state. Immediately before switching from the inactive state to the active state, the reference voltage supply line RL is at 0 volts, and hence the voltage on the RL increases gradually immediately after the transistor 23 switches from the on condition to the off condition, and eventually reaches the threshold voltage value $V_R$.

The high-speed startup drive circuit 5 applies the voltage VCC onto the reference voltage supply line RL during a predetermined time period immediately after the enable signal CE switches from 0 to 1 in logic level. This creates (defines) a voltage rise segment of the reference voltage Vref.

Figure 3:
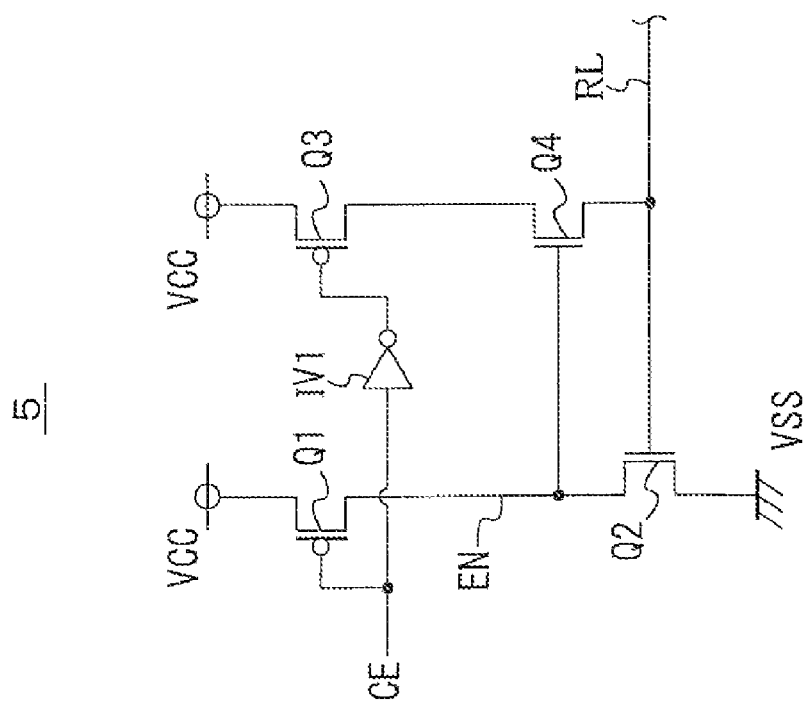
FIG. 3 is a circuit diagram of a high-speed startup drive circuit provided in the semiconductor memory shown in FIG. 1.

FIG. 3 illustrates an example of the internal configuration of the high-speed startup drive circuit 5.

As shown in FIG. 3, the high-speed startup drive circuit 5 includes transistors Q1 and Q3 that are p-channel MOS FETs, transistors Q2 and Q4 that are n-channel MOS FETs, and an inverter IV1. These transistors Q1 to Q4 are all enhancement-type FETs.

The enable signal CE is supplied to the gate terminal of the transistor Q1. The voltage VCC is applied to the source terminal of the transistor Q1. The drain terminal of the transistor Q1 is connected via a line EN to the drain terminal of the transistor Q2 and to the gate terminal of the transistor Q4. Ground potential VSS is applied to the source terminal of the transistor Q2. The gate terminal of the transistor Q2 is connected to the source terminal of the transistor Q4 and the reference voltage supply line RL.

The operation of the semiconductor memory 10 shown in FIG. 1 will be described below with reference to FIG. 4.

When the read signal RD is not supplied, i.e., when the reading of information data is not performed, the memory control unit 1 generates the enable signal CE having a logic level of 0 to render the sense amplifier 3, the reference amplifier 4 and the high-speed startup drive circuit 5 inactive. This enable signal CE is sent to the sense amplifier 3, the reference amplifier 4 and the high-speed startup drive circuit 5 so as to causes the sense amplifier 3, the reference amplifier 4 and the high-speed startup drive circuit 5 to stop operating. During this time, the reference amplifier 4 and the high-speed startup drive circuit 5 are inactive, and hence the reference voltage Vref on the reference voltage supply line RL is 0 volts as shown in FIG. 4. That is, because of the enable signal CE having a logic level of 0, the transistor Q1 of the high-speed startup drive circuit 5 becomes the on condition, and the transistor Q3 of the high-speed startup drive circuit 5 becomes the off condition. The transistor Q2 of the high-speed startup drive circuit 5 enters the off condition because the voltage on the reference voltage supply line RL is 0 volts. Because the transistor Q1 is in the on condition and the transistor Q2 is in the off condition, the voltage on the line EN in the high-speed startup drive circuit 5 is a high voltage corresponding to the voltage VCC, and the transistor Q4 is turned on. However, because the transistor Q3 is in the off condition, the high-speed startup drive circuit 5 does not apply a voltage onto the reference voltage supply line RL. While the enable signal CE is at a logic level of 0, the reference amplifier 4 also does not operate. Thus, no voltage is applied onto the reference voltage supply line RL. During this time, therefore, the reference voltage Vref on the reference voltage supply line RL is 0 volts as shown in FIG. 4.

As such, during the time periods that read access is not performed in the semiconductor memory 10, not only the sense amplifier 3 but also the reference amplifier 4 are forced to stop operating, and hence power consumption is reduced.

When the read signal RD is supplied, the memory control unit 1 supplies the enable signal CE having a logic level of 1 to the sense amplifier 3, the reference amplifier 4 and the high-speed startup drive circuit 5. This enable signal CE is for activation of the sense amplifier 3, the reference amplifier 4, and the high-speed startup drive circuit 5. When the enable signal CE shifts to 1 in logic level, the reference amplifier 4 generates the reference voltage Vref having the predetermined threshold voltage value $V_R$ based on the power supply voltage, and applies the reference voltage onto the reference voltage supply line RL. With the reference amplifier 4 alone, the reference voltage Vref having a rise waveform segment indicated by the single-dot chain line in FIG. 4 (i.e., the voltage gradually rises from 0 volts to the threshold voltage value $V_R$) would be applied onto the reference voltage supply line RL.

When the enable signal CE shifts to 1 in logic level, the transistor Q3 of the high-speed startup drive circuit 5 shifts to the on condition, so that the voltage VCC is applied onto the reference voltage supply line RL via the transistors Q3 and Q4. Hence, the voltage on the reference voltage supply line RL sharply rises from 0 volts as indicated by the solid line in FIG. 4. Then, as shown in FIG. 4, when the voltage on the reference voltage supply line RL exceeds the gate threshold voltage value $V_{N1}$ of the transistor Q2 of the high-speed startup drive circuit 5, the transistor Q2 shifts to the on condition. Thus, ground potential VSS is applied onto the reference voltage supply line RL, and hence the potential on the line EN gradually decreases as shown in FIG. 4. When the potential difference $V_Q$ between the potential on the line EN and the potential on the reference voltage supply line RL as shown in FIG. 4 becomes less than or equal to the threshold voltage value of the transistor Q4, the transistor Q4 shifts to the off condition, and thus the voltage on the reference voltage supply line RL stops rising. The voltage rise segment of the reference voltage Vref is defined by the time period ts from when the voltage on the reference voltage supply line RL starts rising from 0 volts to when that voltage stops rising.

As described above, only during the time period ts immediately after the enable signal CE shifts from 0 to 1 in logic level, the transistors Q3 and Q4 in the high-speed startup drive circuit 5 (FIG. 3) are both turned on to forcibly apply the voltage VCC onto the reference voltage supply line RL, thereby forming the voltage rise segment of the reference voltage Vref. As compared with the case where the voltage on the reference voltage supply line RL is increased by the reference amplifier 4 alone without using the high-speed startup drive circuit 5 (as indicated by the single-dot chain line in FIG. 4), the voltage on the reference voltage supply line RL steeply increases. In this voltage rise segment, an overshoot occurs when the voltage is temporarily higher than the threshold voltage value $V_R$ as shown in FIG. 4. Thereafter, the voltage on the reference voltage supply line RL gradually decreases. If immediately thereafter the sense amplifier 3 starts operating, however, the voltage on the reference voltage supply line RL rises again due to switching noises upon turning on of the sense amplifier 3, so that the overshoot continues, as shown in FIG. 4. Subsequently, the voltage on the reference voltage supply line RL gradually decreases converging on the target threshold voltage value $V_R$.

Figure 4:
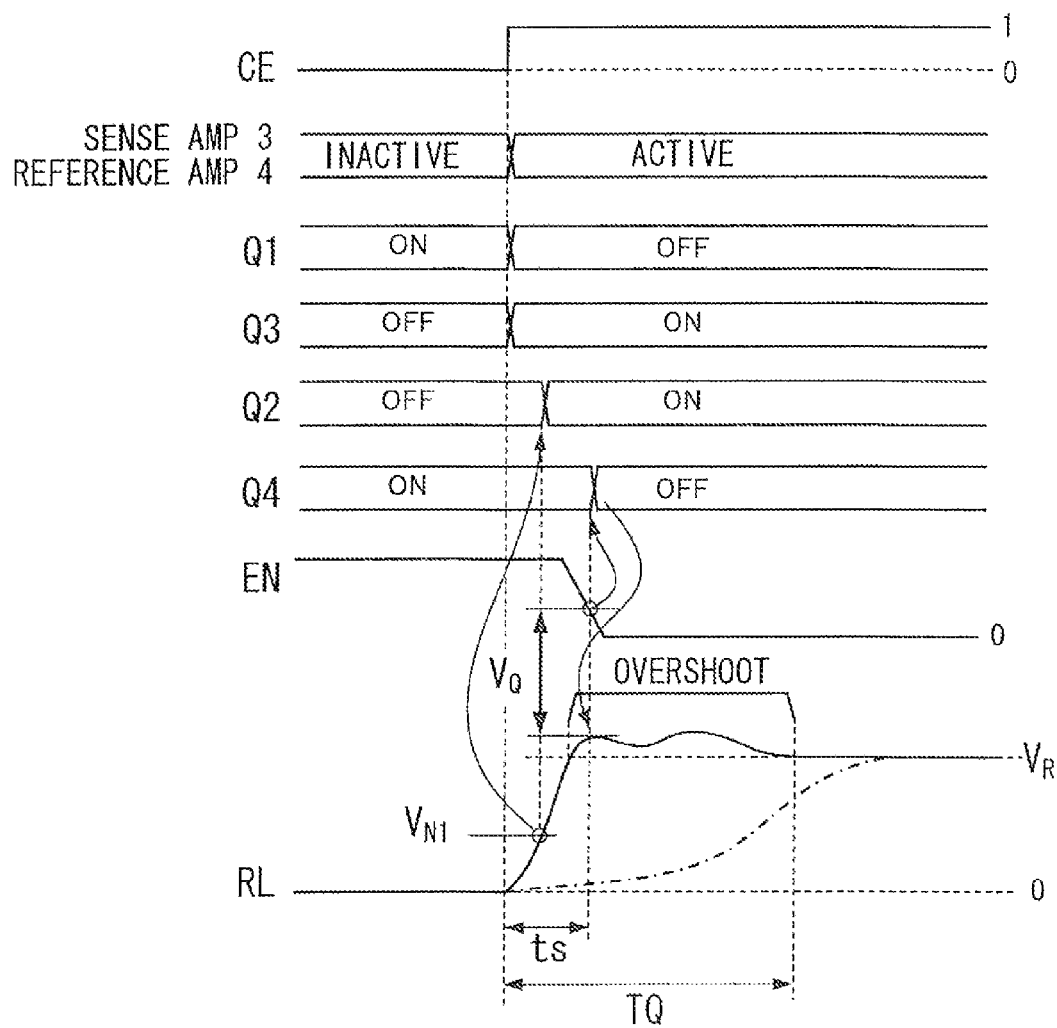
FIG. 4 is a time chart for explaining the operation of the high-speed startup drive circuit shown in FIG. 3.

Thus, after the convergence period TQ elapses from when the enable signal CE switches from 0 to 1 in logic level to when the voltage on the reference voltage supply line RL reaches the threshold voltage value $V_R$ as shown in FIG. 4, the sense amplifier 3 can determine the logic level of read-out data based on the reference voltage Vref having the threshold voltage value $V_R$. That is, after the convergence period TQ elapses from when the enable signal CE switches from 0 to 1 in logic level, information data stored in the memory cell array 2 can be read.

As such, with the high-speed startup drive circuit 5, as shown in FIG. 4, the voltage value of the reference voltage Vref can quickly increase from 0 volts to the target threshold voltage value $V_R$ as compared with the case where the reference voltage Vref is generated by the reference amplifier 4 alone without using the high-speed startup drive circuit 5 (as indicated by the dot-dashed line in FIG. 4).

Thus, immediately after the sense amplifier 3 and the reference amplifier 4 are brought into the active state from the inactive state, information data becomes retrievable.

The high-speed startup drive circuit 5 only includes the four transistors Q1, Q3, Q2 and Q4 and the single inverter IV1 as shown in FIG. 3. Thus, high-speed data reading can be performed with low power consumption and without greatly increasing the circuit scale.

The high-speed startup drive circuit 5 can have even faster read-access by eliminating the overshoot in the voltage rise segment as shown in FIG. 4. This modification will be described with reference to FIG. 5.

Figure 5:
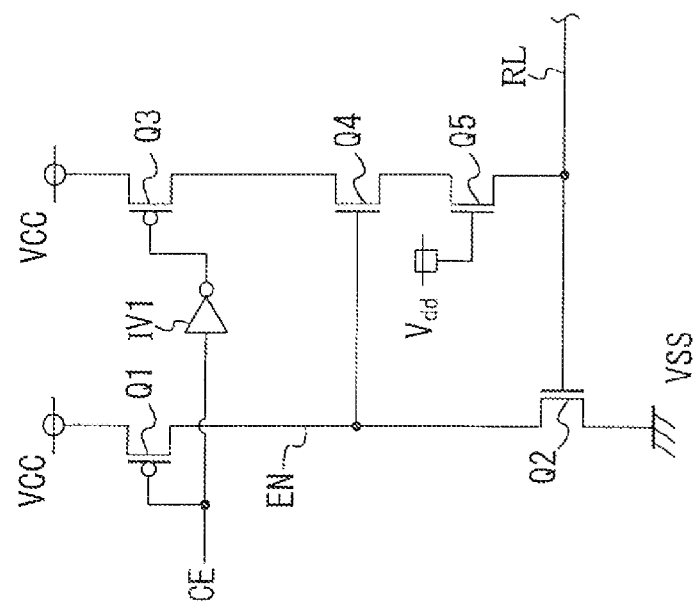
FIG. 5 is a circuit diagram showing another example of the high-speed startup drive circuit.

FIG. 5 shows an internal configuration of the modified high-speed startup drive circuit 5.

The high-speed startup drive circuit 5 shown in FIG. 5 is the same in configuration as the one shown in FIG. 3 except that a transistor Q5 that is an n-channel MOS FET is interposed between the transistor Q4 and the reference voltage supply line RL shown in FIG. 3. Similar reference numerals and symbols are used in FIGS. 3 and 5 to designate similar parts, elements and functions.

In FIG. 5, the source terminal of the transistor Q5 is connected to the reference voltage supply line RL, and the drain terminal of the transistor Q5 is connected to the source terminal of the transistor Q4. A predetermined voltage Vdd of positive polarity is supplied to the gate terminal of the transistor Q5.

Figure 6:
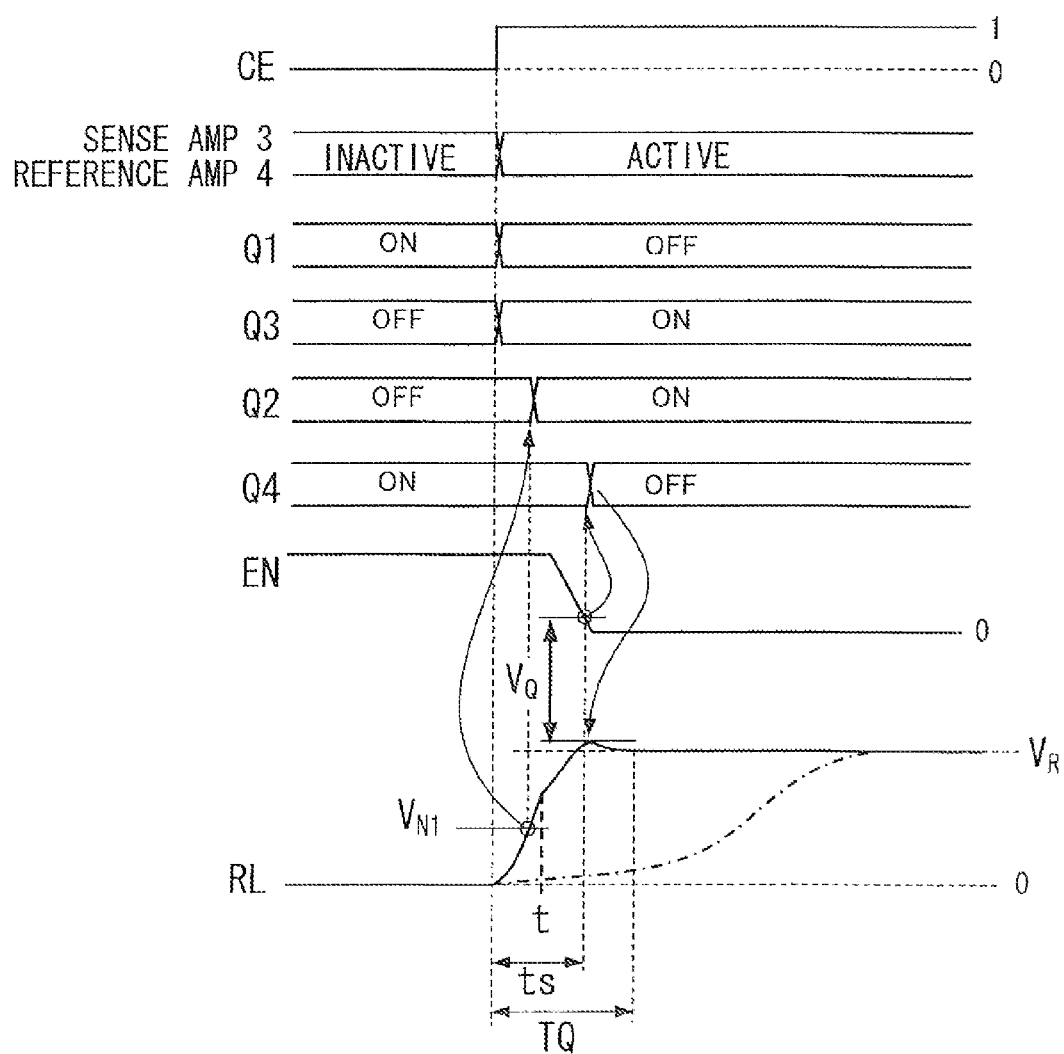
FIG. 6 is a time chart for explaining the operation of the high-speed startup drive circuit shown in FIG. 5.

The operation of creating the voltage rise segment of the reference voltage Vref by the high-speed startup drive circuit 5 having the configuration shown in FIG. 5 will be described below with reference to FIG. 6.

First, while the enable signal CE having a logic level of 0 is being supplied, the transistors Q1 and Q4 of the high-speed startup drive circuit 5 are in the on condition, and the transistors Q3 and Q2 of the high-speed startup drive circuit 5 are in the off condition. This is the same as the configuration shown in FIG. 3. Hence, the high-speed startup drive circuit 5 does not apply a voltage onto the reference voltage supply line RL. While the enable signal CE is at a logic level of 0, the reference amplifier 4 also does not operate. Thus, no voltage is applied onto the reference voltage supply line RL. During this time, therefore, the reference voltage Vref on the reference voltage supply line RL is 0 volts as shown in FIG. 6.

Thereafter, when the read signal RD is supplied, the memory control unit 1 supplies the enable signal CE having a logic level of 1 to the sense amplifier 3, the reference amplifier 4 and the high-speed startup drive circuit 5 to activate the amplifiers 3 and 4 and the circuit 5. When the enable signal CE shifts to 1 in logic level, the reference amplifier 4 starts generation of the reference voltage Vref having the predetermined threshold voltage value $V_R$ based on the power supply voltage, and applies this voltage onto the reference voltage supply line RL. With the reference amplifier 4 alone, the reference voltage Vref having a rise waveform whose voltage gradually rises from 0 volts to the threshold voltage value $V_R$ as indicated by the dot-dashed line in FIG. 6 would be applied onto the reference voltage supply line RL.

When the enable signal CE shifts to 1 in logic level, the transistor Q3 of the high-speed startup drive circuit 5 enters the on condition, so that the voltage VCC is applied onto the reference voltage supply line RL via the transistors Q3 and Q4. Hence, the voltage on the reference voltage supply line RL sharply rises from 0 volts as indicated by the solid line in FIG. 6. With this voltage increase, the source-to-drain voltage of the transistor Q5 decreases. Thus, the transistor Q5 begins to operate in its linear region, and the drain current flowing through the transistor Q5 steeply decreases. Thus, the voltage increase during the voltage rise segment of the reference voltage Vref becomes gentle after, e.g., the time t shown in FIG. 6. When the voltage on the reference voltage supply line RL exceeds the gate threshold voltage value $V_{N1}$ of the transistor Q2 of the high-speed startup drive circuit 5 as shown in FIG. 6, the transistor Q2 shifts to the on condition. Thus, ground potential VSS is applied onto the reference voltage supply line RL, and hence the potential on the line EN gradually decreases as shown in FIG. 6. When the potential difference $V_Q$ between the potential on the line EN and the potential on the reference voltage supply line RL as shown in FIG. 6 becomes less than or equal to the threshold voltage value of the transistor Q4, the transistor Q4 shifts to the off condition, and thus the voltage on the reference voltage supply line RL stops rising. During the time period is from when the voltage on the reference voltage supply line RL starts rising from 0 volts until it stops rising, the voltage rise segment of the reference voltage Vref is formed.

With the above-described driving, an overshoot (i.e., the voltage becomes considerably higher than the target threshold voltage value $V_R$ as shown in FIG. 4) is avoided in the voltage rise segment of the reference voltage Vref. The voltage increase over time in the voltage rise segment becomes gentle after the time t. When the sense amplifier 3 starts operating after the time t, therefore, a voltage increase due to switching noise at the operation start of the sense amplifier 3 can be avoided. Although the voltage increase over time in the voltage rise segment becomes gentle after the time t, the voltage value quickly converges on the threshold voltage value $V_R$ because of no overshoot as shown in FIG. 6. As a result, the convergence period TQ from when the enable signal switches from 0 to 1 in logic level to when the voltage on the reference voltage supply line RL reaches the threshold voltage value $V_R$ is shorter than in the case where an overshoot occurs as shown in FIG. 4.

That is, if the configuration shown in FIG. 5 is adopted for the high-speed startup drive circuit 5, information data can be read at higher speed as compared with the case where the configuration shown in FIG. 3 is adopted.

It should be noted that instead of an enhancement-type FET, a depletion-type FET may be used as the transistor Q5 shown in FIG. 5. This modification will be described with reference to FIG. 7.

Figure 7:
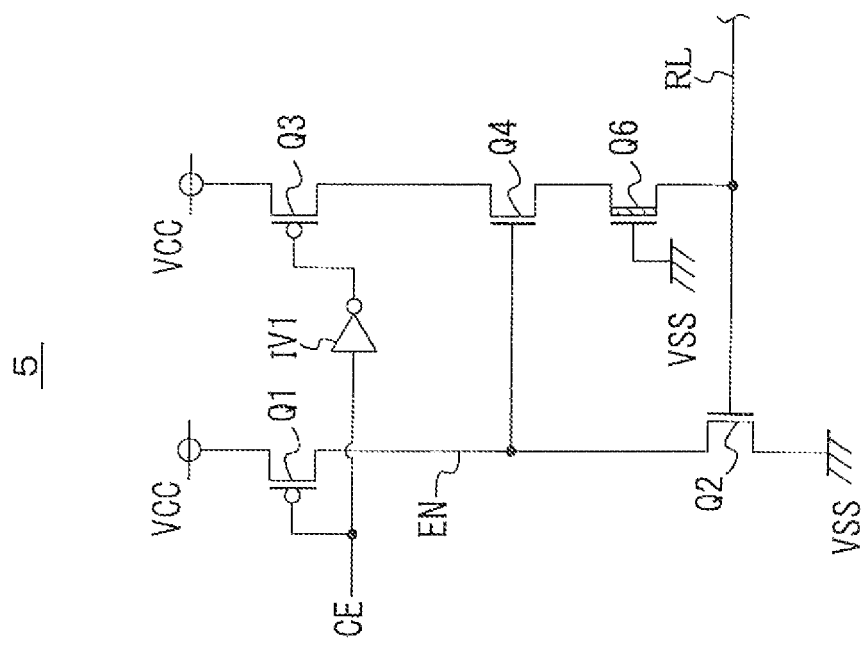
FIG. 7 is a circuit diagram showing still another example of the high-speed startup drive circuit.

FIG. 7 shows an internal configuration of a modified high-speed startup drive circuit 5.

The high-speed startup drive circuit 5 shown in FIG. 7 is the same in configuration as the one shown in FIG. 5 except that a transistor Q6 that is a depletion-type n-channel MOSFET is used instead of the enhancement-type transistor Q5 shown in FIG. 5. Similar reference numerals are used in FIGS. 5 and 7 to designate similar parts, elements and functions.

In FIG. 7, the source terminal of the transistor Q6 is connected to the reference voltage supply line RL, and the drain terminal of the transistor Q6 is connected to the source terminal of the transistor Q4. Ground potential VSS is fixedly supplied to the gate terminal of the transistor Q6.

Figure 8:
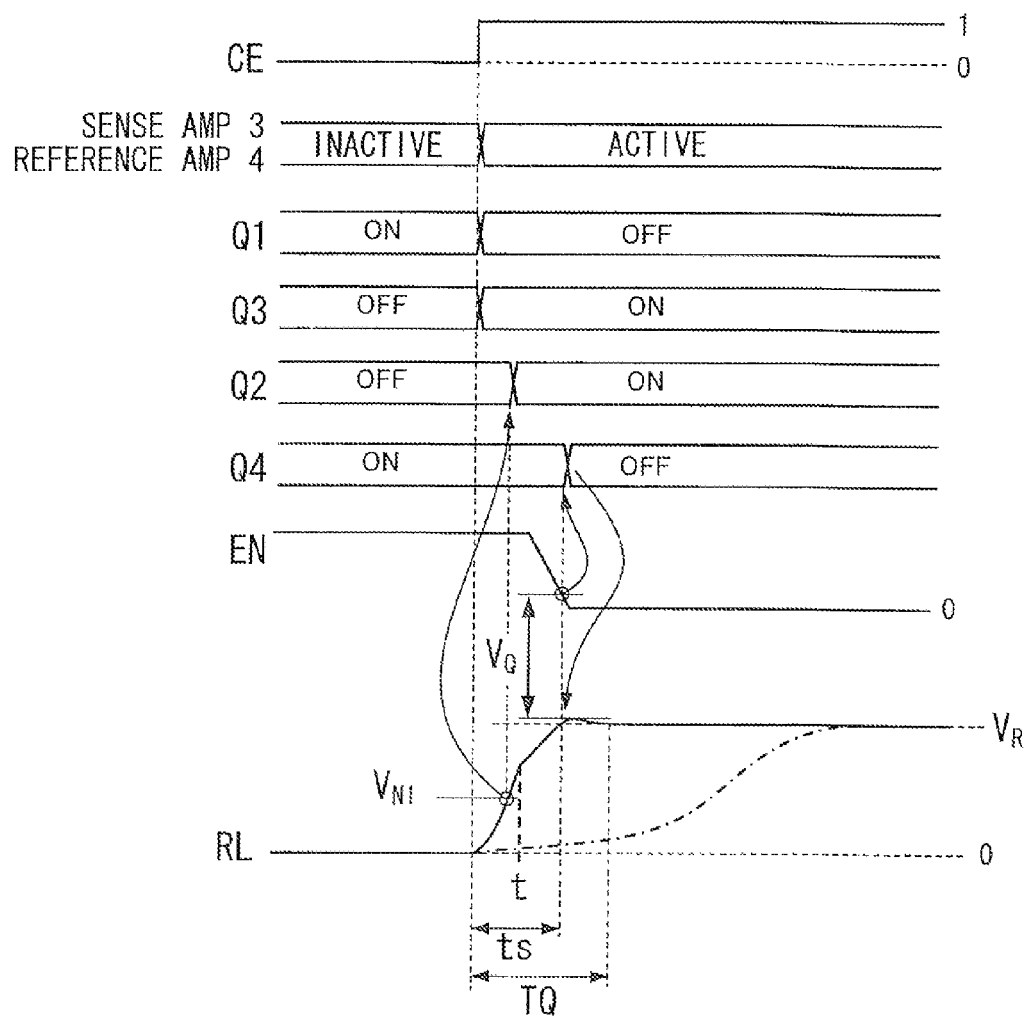
FIG. 8 is a time chart for explaining the operation of the high-speed startup drive circuit shown in FIG. 7.

The operation of forming the voltage rise segment of the reference voltage Vref by the high-speed startup drive circuit 5 having the configuration shown in FIG. 7 will be described below with reference to FIG. 8.

While the enable signal CE having a logic level of 0 is being supplied, the transistors Q1 and Q4 of the high-speed startup drive circuit 5 are in the on condition, and the transistors Q3 and Q2 of the high-speed startup driver circuit 5 are in the off condition. This is the same as the configuration shown in FIG. 5. Hence, the high-speed startup drive circuit 5 does not apply a voltage onto the reference voltage supply line RL. While the enable signal CE is at a logic level of 0, the reference amplifier 4 also does not operate and therefore no voltage is applied onto the reference voltage supply line RL. Thus, during this time, the reference voltage Vref on the reference voltage supply line RL is 0 volts as shown in FIG. 8.

Thereafter the read signal RD is supplied. Upon receiving the read signal RD, the memory control unit 1 supplies the enable signal CE having a logic level of 1 to the sense amplifier 3, the reference amplifier 4 and the high-speed startup drive circuit 5 so as to activate the sense amplifier 3, the reference amplifier 4 and the high-speed startup drive circuit 5. When the enable signal CE shifts to 1 in logic level, the reference amplifier 4 starts generating the reference voltage Vref having the threshold voltage value $V_R$ based on the power supply voltage, and applies this voltage onto the reference voltage supply line RL. With the reference amplifier 4 alone, the reference voltage Vref having a rise waveform whose voltage gradually rises from 0 volts to the threshold voltage value $V_R$ as indicated by the dot-dashed line in FIG. 8 would be applied onto the reference voltage supply line RL.

When the enable signal CE reaches 1 in logic level, the transistor Q3 of the high-speed startup drive circuit 5 shifts to the on condition, so that the voltage VCC is applied onto the reference voltage supply line RL via the transistors Q3 and Q4. Hence, the voltage on the reference voltage supply line RL sharply rises from 0 volts as indicated by the solid line in FIG. 8. With this voltage increase, the source-to-drain voltage of the transistor Q6 decreases, and the transistor Q6 begins to operate in its linear region, so that the drain current flowing through the transistor Q6 rapidly decreases. Thus, the voltage increase over time in the voltage rise segment of the reference voltage Vref becomes gentle after, e.g., the time t in FIG. 8. When the voltage on the reference voltage supply line RL exceeds the gate threshold voltage value $V_{N1}$ of the transistor Q2 of the high-speed startup drive circuit 5 as shown in FIG. 8, the transistor Q2 shifts to the on condition. Thus, ground potential VSS is applied onto the reference voltage supply line RL, and hence the potential on the line EN gradually decreases as shown in FIG. 8. When the potential difference $V_Q$ between the potential on the line EN and the potential on the reference voltage supply line RL as shown in FIG. 8 becomes less than or equal to the threshold voltage value of the transistor Q4, the transistor Q4 shifts to the off condition, and thus the voltage on the reference voltage supply line RL stops rising. During the time period is from when the voltage on the reference voltage supply line RL start rising from 0 volts until it stops rising, the voltage rise segment of the reference voltage Vref is formed.

With the above-described driving, an overshoot (i.e., the voltage becomes significantly higher than the target threshold voltage value $V_R$ as shown in FIG. 4) is avoided in the voltage rise segment of the reference voltage Vref. Further, the voltage increase over time in the voltage rise segment becomes gentle after the time t. If the sense amplifier 3 starts operating after the time t, therefore, a voltage increase due to switching noise at the operation start of the sense amplifier 3 can be avoided. Although the voltage increase over time in the voltage rise segment becomes gradual after the time t, its voltage value quickly converges on the threshold voltage value $V_R$ as shown in FIG. 8 because no overshoot occurs. As a result, the convergence period TQ from when the enable signal switches from 0 to 1 in logic level to when the voltage on the reference voltage supply line RL reaches the threshold voltage value $V_R$ is shorter than in the case where an overshoot occurs as shown in FIG. 4.

That is, where the configuration shown in FIG. 7 is adopted for the high-speed startup drive circuit 5, information data can be read at higher speed as compared with the case where the configuration shown in FIG. 3 is adopted. In the configuration shown in FIG. 7 the transistor Q6 that is a depletion-type n-channel MOSFET is used instead of the transistor Q5 that is an enhancement-type n-channel MOSFET shown in FIG. 5. Even if the ground potential VSS is applied to the gate terminal of the transistor Q6, the high-speed startup drive circuit 5 is still possible to perform the expected operation in the linear region.

Hence, a more stable convergence period TQ can be obtained as compared with the case of using the enhancement-type transistor Q5. The transistor Q5 is designed to operate in its linear region by fixedly supplying the voltage Vdd of positive polarity to the gate terminal of the transistor Q5.

Figure 9:
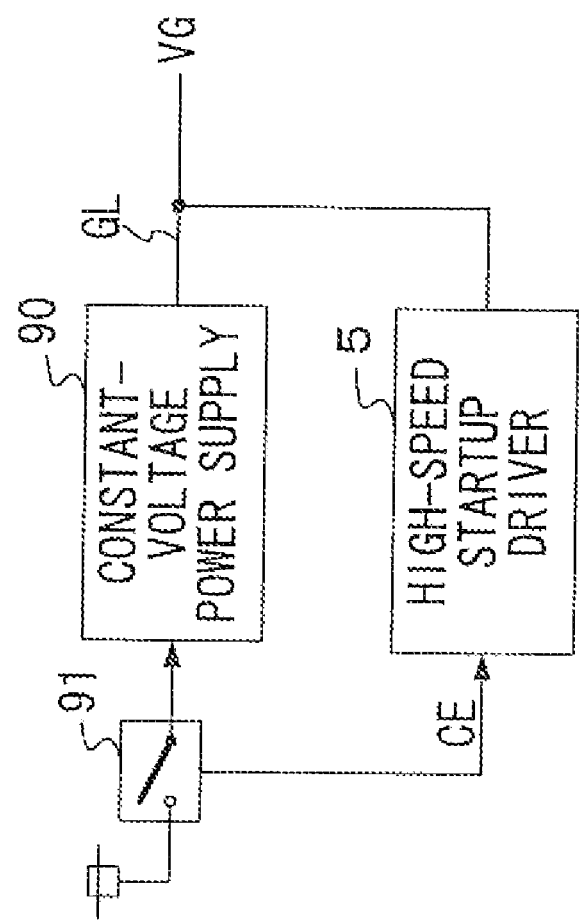
FIG. 9 is a block diagram of a system that includes the high-speed startup drive circuit shown in FIG. 3 when the high-speed startup drive circuit is used for a different purpose.

Although in the above-described embodiment the high-speed startup drive circuit 5 is used in order to make the reference voltage rise fast(er), which is the threshold value used when the sense amplifier 3 determines the logic level, this high-speed startup drive circuit 5 may be used to make the output voltage of a constant-voltage power supply unit rise fast(er) as shown in FIG. 9. This implementation of the drive circuit 5 will be described below with reference to FIG. 9.

In FIG. 9, when a power supply switch 91 is switched from the off condition to the on condition to start the supply of a power supply voltage, the constant-voltage power supply unit 90 generates an output voltage VG having a predetermined constant voltage value based on the power supply voltage and applies the resulting voltage VG onto a power supply line GL. The power supply switch 91 supplies an enable signal of a logic level of 0 when the switch 91 is in the off condition or a logic level of 1 when the switch 91 is in the on condition to the high-speed startup drive circuit 5. The high-speed startup drive circuit 5 shown in FIG. 9 has the same internal configuration as that shown in FIG. 3, 5 or 7, and performs the above-described driving on the power supply line GL in response to the enable signal of a logic level of 1. Thus, the voltage steeply increases in the voltage rise segment of the output power supply voltage VG applied to the power supply line GL. Because of this steep voltage increase, the voltage value of the output voltage VG rises fast to a target constant voltage value upon power-on.

This application is based on Japanese Patent Application No. 2010-230559 filed on Oct. 13, 2010, and the entire disclosure thereof is incorporated herein by reference.

What is claimed is:

1. A semiconductor memory comprising:
   a memory cell having a data line;
   a sense amplifier that generates information data having a logic level corresponding to a result of comparing, in magnitude, a value of a current supplied to the data line of the memory cell in response to a read signal and a predetermined threshold value;
   a control unit that generates an enable signal indicating one of an activation state and a deactivation state;
   a reference amplifier that, when said enable signal has shifted from the deactivation state to the activation state, generates a reference voltage having a voltage value equal to said predetermined threshold value and supplies the reference voltage to said sense amplifier via a reference voltage supply line; and
   a high-speed startup drive unit including a first FET, a second FET, a third FET and a fourth FET, the first FET being turned on to apply a predetermined first voltage onto a first line when said enable signal indicates the deactivation state, the second FET being turned on to apply ground potential onto said first line when the voltage on said reference voltage supply line is higher than a gate threshold voltage value, the third FET being turned on to generate said first voltage when said enable signal indicates the activation state, and the fourth FET being turned off when said first line is at ground potential and being turned on to supply said first voltage from said third FET onto said reference voltage supply line when said first voltage is applied onto said first line.

2. The semiconductor memory according to claim 1, wherein said high-speed startup drive unit further includes a fifth FET, a drain terminal and source terminal of the fifth FET are connected respectively to said fourth FET and said reference voltage supply line, and a predetermined second voltage is fixedly supplied to a gate terminal of the fifth FET.

3. The semiconductor memory according to claim 2, wherein said first to fourth FETs are enhancement-type MOSFETs, said fifth FET is a depletion-type MOSFET, and said second voltage applied to the gate terminal of said fifth FET is the ground potential.

4. The semiconductor memory according to claim 1, wherein said control unit supplies said enable signal indicating the deactivation to both said reference amplifier and said high-speed startup drive unit when said read signal is not being supplied, and supplies said enable signal indicating the activation to both said reference amplifier and said high-speed startup drive unit when said read signal is being supplied.

5. The semiconductor memory according to claim 1, wherein said sense amplifier is in a deactivated condition when the enable signal having a logic level of 0 is supplied, and said sense amplifier is in an active condition when the enable signal having a logic level of 1 is supplied.

6. The semiconductor memory according to claim 2, wherein said first and third FET are p-channel MOSFET and said second, fourth and fifth FET are n-channel MOSFETs.

7. The semiconductor memory according to claim 1 further comprising means for avoiding an overshoot in a rising portion of a waveform of the reference voltage.

8. A high-speed startup drive circuit for use in a semiconductor memory, said semiconductor memory including:
a memory cell having a data line;
a sense amplifier that generates information data having a logic level corresponding to a result of comparing, in magnitude, a value of a current supplied to the data line of the memory cell in response to a read signal and a predetermined threshold value;
a control unit that generates an enable signal indicating one of an activation state and a deactivation state; and
a reference amplifier that, when said enable signal has shifted from the deactivation state to the activation state, generates a reference voltage having a voltage value equal to said predetermined threshold value and supplies the reference voltage to said sense amplifier via a reference voltage supply line,
said high-speed startup drive circuit comprising:
a first FET that is turned on to apply a predetermined first voltage onto a first line when said enable signal indicates the deactivation state;
a second FET that is turned on to apply ground potential onto the first line when the voltage on said reference voltage supply line is higher than a gate threshold voltage value;
a third FET that is turned on to generate said first voltage when said enable signal indicates the activation state; and
a fourth FET that is turned off when said first line is at ground potential and is turned on to supply said first voltage from said third FET onto said reference voltage supply line when said first voltage is applied onto said first line.

9. The high-speed startup drive circuit according to claim 8 further comprising a fifth FET, wherein a drain terminal and source terminal of the fifth FET are connected respectively to said fourth FET and said reference voltage supply line, and a predetermined second voltage is fixedly supplied to a gate terminal of the fifth FET.

10. The high-speed startup drive circuit according to claim 9, wherein said first to fourth FETs are enhancement-type MOSFETs, said fifth FET is a depletion-type MOSFET, and said second voltage applied to the gate terminal of said fifth FET is the ground potential.

11. The high-speed startup drive circuit according to claim 8, wherein said control unit supplies said enable signal indicating the deactivation to both said reference amplifier and said high-speed startup drive circuit when said read signal is not being supplied, and supplies said enable signal indicating the activation to both said reference amplifier and said high-speed startup drive circuit when said read signal is being supplied.

12. The high-speed startup drive circuit according to claim 8, wherein said sense amplifier is in a deactivated condition when the enable signal having a logic level of 0 is supplied, and said sense amplifier is in an active condition when the enable signal having a logic level of 1 is supplied.

13. The high-speed startup drive circuit according to claim 9, wherein said first and third FET are p-channel MOSFET and said second, fourth and fifth FET are n-channel MOSFETs.

14. The high-speed startup drive circuit according to claim 8 further comprising means for avoiding an overshoot in a rising portion of a waveform of the reference voltage.

* * * * *